United States Patent [19]

Ito et al.

[11] 4,403,262

[45] Sep. 6, 1983

[54] AUDIO SIGNAL MUTING CIRCUIT FOR MAGNETIC RECORDING AND REPRODUCING APPARATUS

[75] Inventors: Shigeyuki Ito, Yokohama; Yoshizumi Watatani, Fujisawa, both of Japan

[73] Assignee: Hitachi, Ltd., Tokyo, Japan

[21] Appl. No.: 298,347

[22] Filed: Sep. 1, 1981

[30] Foreign Application Priority Data

Sep. 3, 1980 [JP] Japan .............................. 55-121055

[51] Int. Cl.$^3$ .......................... G11B 15/02; G11B 5/04
[52] U.S. Cl. ..................................... 360/19.1; 360/30; 360/38.1
[58] Field of Search ................. 360/19.1, 30, 32, 38.1, 360/67

[56] References Cited

U.S. PATENT DOCUMENTS

| | | | |
|---|---|---|---|
| 4,146,099 | 3/1979 | Matsushime et al. | 360/32 |
| 4,309,726 | 1/1982 | Tanaka et al. | 360/32 |
| 4,321,618 | 3/1982 | Hivose et al. | 360/38.1 |

Primary Examiner—Vincent P. Canney
Attorney, Agent, or Firm—Antonelli, Terry & Wands

[57] ABSTRACT

In an apparatus for recording a frequency modulated audio signal and a frequency modulated video signal on the frequency multiplex basis onto the same recording track, a muting circuit is necessary so that the reproduced audio signal is not outputted when a dropout takes place and/or when the frequency modulated audio signal is missing on the track. The muting circuit is controlled not only by the output signal of a dropout detector, but by a signal obtained by integrating the dropout detection signal so that the audio output is blocked during a frequent occurrence of dropout. The muting circuit includes a previous value holding circuit serving to hold its output at an input level immediately before the control signal has been given, the previous value holding circuit being arranged in the reproduction audio signal processing system following a demodulator.

3 Claims, 11 Drawing Figures

AUDIO SIGNAL MUTING CIRCUIT FOR MAGNETIC RECORDING AND REPRODUCING APPARATUS

The present invention relates to a muting circuit for use in a circuit which reproduces the recorded frequency modulated audio signal, and more particularly to a muting circuit for eliminating noise from an audio signal reproduced by a magnetic recording and reproducing apparatus which records and reproduces a frequency modulated video signal and a frequency modulated audio signal on the frequency division multiplex basis.

In a typical, currently used magnetic recording and reproducing apparatus for a video signal, a video signal is recorded on a skewed track on a magnetic tape by means of a rotary head and an audio signal is recorded on a longitudinal track provided at the edge of the magnetic tape by means of a fixed head. In such magnetic recording and reproducing apparatus, it is desired to record the signal as long as possible on a tape of a limited length. This is eagerly required especially for the household apparatus. For a longer recording time, a higher recording density is required, which is achieved by a narrower video track and a slower tape speed. As a result, the tape speed which is slower than that of the audio compact cassette tape recorder is required. Although such a slow tape speed is not a problem in recording and reproducing a video signal since the rotational speed of the head dominantly determines the relative speed between the rotary head and the magnetic tape, it would be difficult for the fixed head to obtain the necessary practical frequency band in recording and reproducing an audio signal.

It is contemplated that the audio signal is multiplexed with the video signal, so that it is also recorded on the skewed video track. In this manner, recording and reproduction for obtaining a high quality audio reproduction signal are made possible merely by assigning a part of the wide video signal band to the audio signal.

In multiplexing the audio signal and the video signal, since the recording and reproducing system is generally adapted for recording a frequency modulated video signal, it is desirable for the audio signal to be multiplexed also as a frequency modulated signal having a center frequency separate from the FM video signal band. In the case of the household video tape recorder in which the color subcarrier is converted to a lower band, for example, the FM audio signal can be placed between the FM video signal band and the frequency converted color subcarrier band. The video signal track for the rotary head is very narrow and liable to cause a dropout due to a defect of the magnetic tape, dusts or the like. Therefore, in such audio signal recording and reproducing system, means for counteracting a dropout must be provided. In the case of the audio signal, a defect of the reproduced FM signal caused by a dropout will create noise having a large amplitude. Also a portion of the magnetic tape where no FM signal is recorded will cause the reproducing circuit to create large noise during the reproducing operation. Therefore, it is necessary to prevent the output of such noise.

In order to cope with these problems, there are provided means for detecting a dropout in the reproduced signal and a previous value holding means which holds the demodulated audio signal output during the period of a dropout at a level immediately before it has been detected, so that the dropout compensation and the muting operation take place. Such system functions satisfactorily for a momentary dropout, however, the problem is not solved for a relatively long portion of the tape where only the FM video signal is recorded without the FM audio signal (the dropout detection means generates a dropout detection signal also in this case). The dropout detection means typically consists of means for detecting that the amplitude of the FM signal picked up by the head is smaller than the specified level. Accordingly, the dropout detection means for the audio signal is arranged such that it detects the amplitude of the FM audio signal after the signal has been selected out of the amplified and reproduced FM signal. When the FM audio signal is not recorded for a long period, the amplitude of noise sensed by the dropout detection means often exceeds the detection level irregularly due to the effect of the side band wave of the FM video signal, residual magnetism on the magnetic tape or noise created by the amplifier. As a result, the system operates erroneously as if a normal reproduction output is obtained when the amplitude of a noise is actually large, resulting disadvantageously in an output of large noise.

It is an object of the present invention to provide a muting circuit which effectively eliminates noise from the reproduced output signal caused by dropout and a blank portion of the tape for recording and reproduction system where the audio signal is frequency modulated.

The characteristic of the present invention is that a dropout of the FM audio signal is detected and a compensation circuit such as a previous value holding circuit for conducting the demodulated audio signal is controlled by the dropout detection signal so that the audio output is held during a dropout at a level immediately before the dropout has occurred, and at the same time the dropout detection signal is integrated so that the integrated output also controls the compensation circuit when it exceeds the predetermined value. According to one aspect of the present invention, when dropout occurs frequently in a short period the compensation circuit is controlled to maintain the muting state even if the dropout detection circuit erroneously determines that this is not dropout and the record is reproduced normally. In this manner, the output of unwanted noises can be prevented and effective muting can take place in reproducing a portion of the tape where the FM audio signal is not recorded.

Figure 5:
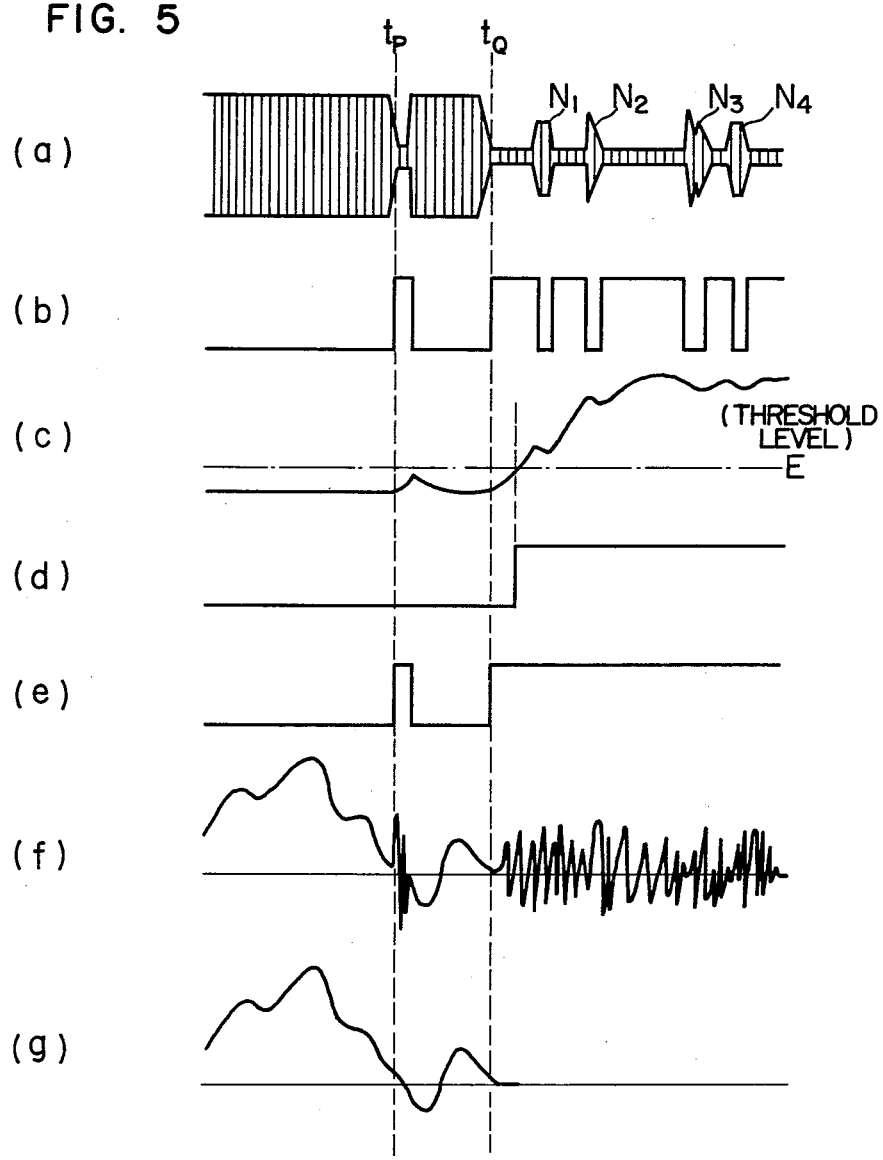

FIG. 5, including a-g, is a set of signal waveform charts useful to explain the operation of the embodiment of the invention.

Figure 1:
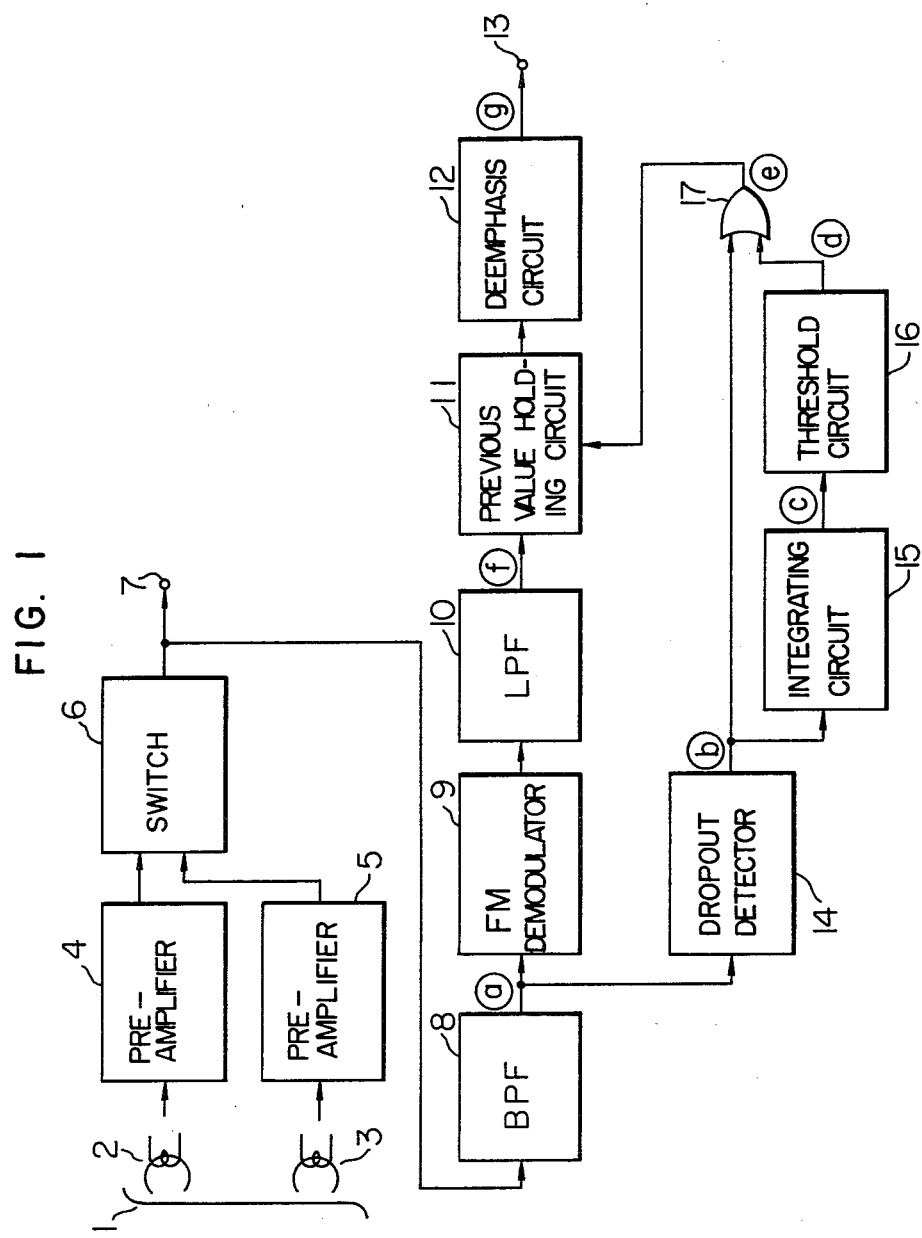
FIG. 1 is a block diagram showing in part the reproduction system of the magnetic recording and reproducing apparatus embodying the present invention.

FIG. 1 shows the primary portion of the reproducing apparatus in which case the present invention is applied to a magnetic recording and reproducing apparatus of 2-head helical scanning system. In the figure, a frequency modulated video signal and a frequency modulated audio signal in the frequency multiplex form are recorded on a magnetic tape 1. The signals are recorded in such a way, for example, that a frequency modulator for generating a modulated wave in response to the video signal and a second frequency modulator which is set to a frequency range separate from the frequency shift by the first mentioned modulator and adapted to perform frequency modulation in response to the audio signal are provided, and the outputs of the two modulators are added and supplied to rotating heads 2 and 3 for recording. This arrangement is identical to that of the well known household 2-head helical scanning video tape recorder, except that the audio signal is multiplexed with the video signal.

In 2-head helical scanning system, as is well known in the art, the two heads 2 and 3 trace the recording track alternately and thus they output the signals alternately. The read out signals are amplified by preamplifiers 4 and 5, and then united into a continuous signal by a switching circuit 6 which operates in synchronization with the rotation of the rotary head. The output of the switching circuit 6 undergoes the selection for the frequency modulated video signal by means of a filter (not shown in the figure) connected to an output terminal 7, and then undergoes the reproduction process for the video signal by a signal processing circuit known in the art. The output of the switching circuit 6 is further undergoes the selection for the frequency modulated audio signal by a band-pass filter 8, then supplied to an FM demodulator 9 and a dropout detector 14. The FM demodulator 9 has an amplitude limiter, and may include an amplifier when necessary. The audio signal demodulated by the demodulator 9 is filtered through a low-pass filter 10 to eliminate unwanted frequency components, and supplied to a previous value holding circuit 11 which performs the muting operation.

Figure 2:
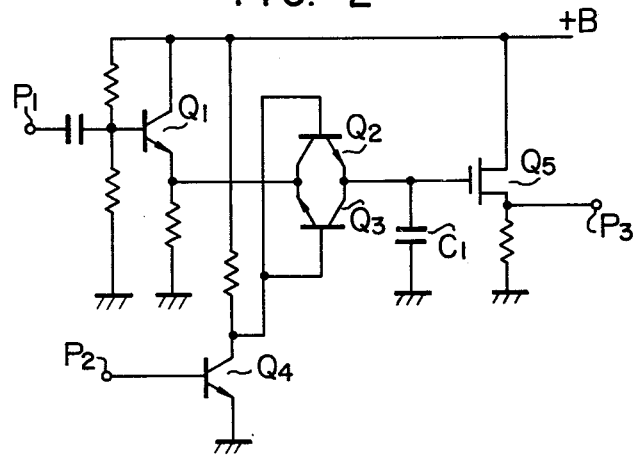
FIG. 2 is a circuit diagram exemplifying the previous value holding circuit.

The previous value holding circuit 11 ceases to conduct the input signal to the output when it receives the control signal, and holds the output at a signal level which was inputted immediately before the control signal has been given. The circuit shown in FIG. 2, for example, may be used as the previous value holding circuit 11. In FIG. 2, an input terminal $P_1$ receives the demodulated audio signal, and a transistor $Q_1$ forms an emitter follower. Transistors $Q_2$ and $Q_3$ are switching devices and turned ON and OFF by a control transistor $Q_4$ which in turn turned ON and OFF by the control signal received at another input terminal $P_2$. When the input terminal $P_2$ does not receive the signal, the transistor $Q_4$ is in a cutoff state causing the transistors $Q_2$ and $Q_3$ to conduct, and the audio signal coming through the emitter follower is conducted to an output terminal $P_3$ through a field effect transistor $Q_5$. When the input terminal $P_2$ receives the control signal (here, the dropout detection signal), the transistor $Q_4$ turns ON to cut off the transistors $Q_2$ and $Q_3$. Consequently, the charging voltage of a capacitor $C_1$ which has been varying in response to the audio signal is fixed to a certain voltage level and outputted through the field effect transistor $Q_5$ having a high input impedance. Accordingly, the audio signal is not conducted during the period when the control signal is given, and thus the muting operation takes place. The audio signal coming through the previous value holding circuit 11 is outputted through a de-emphasis circuit 12. The de-emphasis circuit is commonly used in processing the frequency modulated signal for correcting the frequency response which has been emphasized in the recording process.

Figure 3:
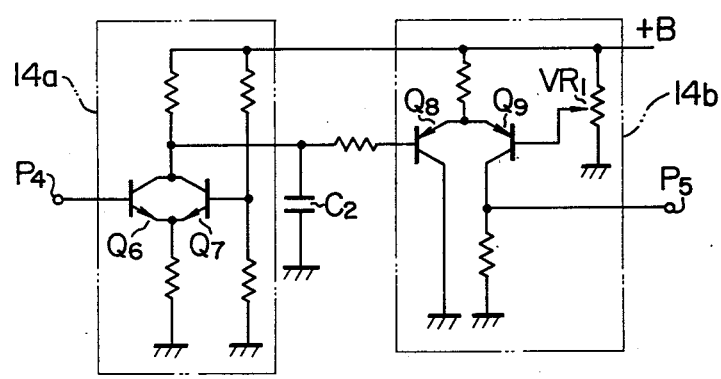
FIG. 3 is a circuit diagram exemplifying the dropout detection circuit.

The circuit for obtaining the control signal, which is a characteristic of the present invention, applied to the previous value holding circuit 11 will now be described. In order to detect a dropout of the FM audio signal picked up from the magnetic tape, but before it is demodulated, the output of the low-pass filter 8 is supplied to a dropout detector 14. The dropout detector 14 detects a decrease in the amplitude of the FM audio signal, and can be constituted by a rectifying circuit and a level discrimination circuit. The circuit shown in FIG. 3 which is suitable for integration may be used, for example, as the dropout detector 14. In FIG. 3, the reference number 14a denotes a rectifying circuit, in which transistors $Q_6$ and $Q_7$ perform rectification and amplification. The FM audio signal supplied to an input terminal $P_4$ is rectified and amplified, then smoothed by a capacitor $C_2$. Then, the signal is supplied to a level discrimination circuit 14b which is constituted by differential transistors $Q_8$ and $Q_9$. If the voltage level of the rectified and smoothed signal is higher than the predetermined value, the collector voltage of the transistors $Q_6$ and $Q_7$ are low and, consequently, the transistor $Q_8$ turns ON and $Q_9$ is cut off, resulting in no output at an output terminal $P_5$. If the voltage level of the rectified signal becomes lower than the predetermined value, the transistor $Q_8$ is cut off and, consequently, the transistor $Q_9$ turns ON, resulting in a high level output at the output terminal $P_5$. The voltage level at which the transistor $Q_9$ turns ON is set by a variable resistor $VR_1$. Accordingly, when a dropout of the FM audio signal occurs, a high level voltage will appear at the output terminal $P_5$ during the period of the dropout. This output is supplied through an OR gate 17 to the previous value holding circuit 11 as a control signal, as shown in FIG. 1, so that the noise does not appear in the audio output signal in the occurrence of the dropout. However, if the previous value holding circuit 11 is operated directly by the detection output of the dropout detector 14, numerous dropout detection outputs in a short period cause the circuit to fail to determine that these outputs are created by noises, and in this case the noise will appear in the reproduced output. In order to prevent such situation, an integrating circuit 15 and a threshold circuit 16 are added as shown in FIG. 1. In operation, the output of the dropout detector 14 is integrated by the integrating circuit 15 and the integrated detection output is discriminated by the threshold circuit 16 such that when the output level exceeds the predetermined value, the control signal for controlling the previous value holding circuit 11 is issued. The output of the threshold circuit 16 and the immediate output of the dropout detector 14 are summed up by the OR gate 17 and supplied to the previous value holding circuit 11. Thus, the previous value holding circuit 11 is controlled by either of the output signals.

Figure 4:
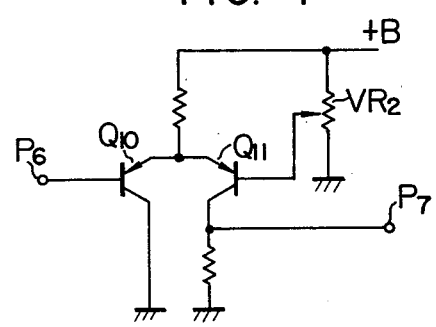
FIG. 4 is a circuit diagram exemplifying the threshold circuit.

The integrating circuit 15 can be formed of a capacitor and a resistor, as is well known in the art, and it may include an amplifier for further amplifying the output of the dropout detector when necessary. For the threshold circuit 16, any circuit which outputs a signal for controlling the previous value holding circuit 11 when an input higher than the predetermined level is given may be used. For example, the circuit shown in FIG. 4 which is similar to the level discrimination circuit 14 in FIG. 3 for constituting the dropout detector 14 may be used. This circuit is adapted to receive the integrated output at its terminal $P_6$. If no dropout occurs or the occurrence of dropout is rare, a low base voltage of the transistor $Q_{10}$ brings it into conduction, causing the transistor $Q_{11}$ to be cut off, and no output appears at the output terminal $P_7$. On the other hand, if dropout occurs frequently in a short period, the integrated dropout detection signal goes high, and when it exceeds the level set by a variable resistor $VR_2$, the transistor $Q_{10}$ is cut off, causing the transistor $Q_{11}$ to turn ON, and a high level output will appear at the output terminal $P_7$.

In this manner, when dropout occurs frequently in a short period, the holding state is maintained by the integrated dropout detection signal, thus the muting operation takes place continuously. Accordingly, during a long absence of a recorded signal on the tape, such malfunctioning that the dropping detector fails to operate due to noise or the like and the holding state is released for a short period to output the noise can be prevented.

Operation of the foregoing arrangement will now be described with reference to the signal waveforms shown in FIG. 5. An assumption is made that in the FM audio signal selected by the low-pass filter 8, a dropout occurs at time $t_P$, and no modulation signal is reproduced after time $t_Q$ as shown in FIG. 5a. It is also assumed that noises $N_1$-$N_4$ having relatively large amplitude occur after the time $t_Q$ due to the effect of the side band wave of the FM video signal and due to noises originated in the recording medium, magnetic head, amplifier, or the like. When such frequency modulation signal is supplied to the dropout detector 14, the noises $N_1$-$N_4$ are erroneously determined as if dropout has ceased, resulting in a detection output as shown in FIG. 5b. It should be noted that demodulation of the signal of FIG. 5a without any compensation will create the noises in the dropout period at $t_P$ and after $t_Q$ as shown in FIG. 5f. When the same signal is compensated by holding solely with the dropout detection signal, the noise caused by the dropout at $t_P$ is suppressed from being outputted owing to the holding operation, but noises will be produced at the points of time corresponding to the original noises $N_1$-$N_4$. The dropout detection signal is integrated as shown in FIG. 5c, where a frequent occurrence of dropout in a short period results in an increase in the integration output. This integration output is supplied to the threshold circuit 16, which produces a high level signal when the integrated signal exceeds the predetermined threshold level E. This signal and the dropout detection signal are summed up by the OR gate 17 to produce a control signal as shown in FIG. 5e. By controlling the previous value holding circuit 11 with the control signal, the demodulation signal of FIG. 5f is varied as shown in FIG. 5g, indicating that a dropout compensation and muting operation are performed correctly.

In the foregoing description, the arrangement was made such that the control signal obtained by integrating the dropout detection signal and the dropout detection signal itself are summed up to produce a signal which controls the previous value holding circuit. Another arrangement is also possible, in which the previous value holding circuit is controlled solely by the dropout detection signal, while a control signal obtained by integrating the dropout detection signal controls the demodulated audio signal by means of a gate provided in arbitrary location following the demodulator so as to perform the muting operation.

What is claimed is:

1. A reproduction audio signal muting circuit for a magnetic recording and reproducing apparatus which records and reproduces a frequency modulated video signal and a frequency modulated audio signal on the frequency multiplex basis onto a magnetic recording medium comprising:

dropout detection means for detecting the amplitude of a frequency modulated audio signal reproduced from a magnetic recording medium, and producing a signal which represents a period in which said amplitude is lower than a predetermined level;

means for integrating the output signal of said dropout detection means, and producing a signal which represents a period in which the integrated output is higher than a predetermined level;

means for demodulating the frequency modulated audio signal reproduced from said magnetic recording medium; and means for conducting the audio signal from said demodulation means, and blocking the audio signal from said demodulation means from being outputted externally of said apparatus when at least one of said dropout detection means and said signal producing means produces an output signal.

2. A muting circuit according to claim 1, wherein said blocking means includes a previous value holding circuit which, when a control signal is given from outside, holds the output at an input signal level immediately before said control signal has been given, and outputs the input signal directly when said control signal is absent.

3. A muting circuit according to claim 2, further comprising a logical sum means for summing up an output signal of said dropout detection means and an output signal of said signal producing means to form a control signal, and supplying said control signal to said previous value holding circuit.

* * * * *